United States Patent
Dungan et al.

(10) Patent No.: US 7,202,560 B2
(45) Date of Patent: Apr. 10, 2007

(54) WAFER BONDING OF MICRO-ELECTRO MECHANICAL SYSTEMS TO ACTIVE CIRCUITRY

(75) Inventors: Thomas E. Dungan, Fort Collins, CO (US); Ronald S. Fazzio, Loveland, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/012,589

(22) Filed: Dec. 15, 2004

(65) Prior Publication Data

US 2006/0128058 A1 Jun. 15, 2006

(51) Int. Cl.
*H01L 23/34* (2006.01)

(52) U.S. Cl. ............... 257/713; 257/678; 257/E21; 257/499

(58) Field of Classification Search ............... 257/678, 257/296, 680, 690, 704, 710, 713, 724, 778, 257/781, 782
See application file for complete search history.

(56) References Cited

U.S. PATENT DOCUMENTS

| | | | |
|---|---|---|---|
| 3,582,839 A | 6/1971 | Pim et al. | |
| 4,320,365 A | 3/1982 | Black et al. | |
| 4,625,138 A | 11/1986 | Ballato | |
| 5,241,456 A | 8/1993 | Marcinkiewicz et al. | |
| 5,448,014 A | 9/1995 | Kong et al. | |
| 5,587,620 A | 12/1996 | Ruby et al. | |
| 6,060,818 A | 5/2000 | Ruby et al. | |
| 6,215,375 B1 | 4/2001 | Larson, III et al. | |
| 6,228,675 B1* | 5/2001 | Ruby et al. | 438/106 |
| 6,252,229 B1 | 6/2001 | Hays et al. | |
| 6,262,637 B1 | 7/2001 | Bradley et al. | |
| 6,384,697 B1 | 5/2002 | Ruby | |
| 6,424,237 B1 | 7/2002 | Ruby et al. | |
| 6,429,511 B2* | 8/2002 | Ruby et al. | 257/704 |
| 6,472,954 B1 | 10/2002 | Ruby et al. | |
| 6,476,536 B1 | 11/2002 | Pensala | |
| 6,479,320 B1* | 11/2002 | Gooch | 438/109 |
| 6,530,515 B1 | 3/2003 | Glenn et al. | |
| 6,534,900 B2 | 3/2003 | Aigner et al. | |
| 6,600,390 B2 | 7/2003 | Frank | |
| 6,635,509 B1 | 10/2003 | Ouellet | |
| 6,657,363 B1 | 12/2003 | Aigner | |
| 6,693,500 B2 | 2/2004 | Yang et al. | |
| 6,710,508 B2 | 3/2004 | Ruby et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,777,263 B1* | 8/2004 | Gan et al. | 438/106 |
| 6,788,170 B1 | 9/2004 | Kaitila et al. | |
| 6,812,619 B1 | 11/2004 | Kaitila et al. | |
| 6,842,088 B2 | 1/2005 | Yamada et al. | |
| 6,903,452 B2* | 6/2005 | Ma et al. | 257/680 |
| 6,924,717 B2 | 8/2005 | Ginsburg et al. | |
| 6,998,940 B2 | 2/2006 | Metzger | |
| 2002/0000646 A1 | 1/2002 | Gooch et al. | |
| 2002/0121944 A1 | 9/2002 | Larson, III et al. | |
| 2003/0001251 A1 | 1/2003 | Cheever et al. | |
| 2003/0006502 A1 | 1/2003 | Karpman | |
| 2003/0087469 A1 | 5/2003 | Ma | |
| 2003/0111439 A1 | 6/2003 | Fetter et al. | |
| 2003/0132493 A1 | 7/2003 | Kang et al. | |
| 2003/0141946 A1 | 7/2003 | Ruby et al. | |
| 2004/0124952 A1 | 7/2004 | Tikka | |
| 2004/0263287 A1 | 12/2004 | Ginsburg et al. | |
| 2005/0012570 A1 | 1/2005 | Korden et al. | |
| 2005/0030126 A1 | 2/2005 | Inoue et al. | |
| 2005/0167795 A1 | 8/2005 | Higashi | |
| 2005/0218488 A1 | 10/2005 | Matsuo | |
| 2006/0103492 A1 | 5/2006 | Feng et al. | |
| 2006/0132262 A1 | 6/2006 | Fazzio et al. | |

FOREIGN PATENT DOCUMENTS

| | | |
|---|---|---|
| EP | 0 973 256 | 1/2000 |
| EP | 1 096 259 | 5/2001 |
| EP | 1 180 494 | 2/2002 |
| EP | 1 249 932 | 10/2002 |
| EP | 1 258 989 | 11/2002 |
| EP | 1 258 990 | 11/2002 |
| EP | 1 517 443 | 3/2005 |
| EP | 1 575 165 | 9/2005 |
| GB | 2 418 791 | 4/2006 |
| WO | WO 01/06647 | 1/2001 |
| WO | WO 01/99276 A1 | 12/2001 |
| WO | WO 02/103900 | 12/2002 |
| WO | WO 03/043188 | 5/2003 |
| WO | WO 2004/051744 | 6/2004 |

OTHER PUBLICATIONS

A partial copy of GB Search Report for Application No. GB0522393.8 mailed Jan. 9, 2006 (4 pgs.).
A partial copy of GB Search Report for Application No. GB0522505.7 mailed Feb. 23, 2006 (4 pgs.).
Auld, B.A., "Acoustic Resonators," Acoustic Fields and Waves in Solids, Second Edition, vol. II, pp. 250-259 (1990).

* cited by examiner

*Primary Examiner*—David Nhu (57) ABSTRACT

A single integrated wafer package includes a micro electro-mechanical system (MEMS) wafer, an active device wafer, and a seal ring. The MEMS wafer has a first surface and includes at least one MEMS component on its first surface. The active device wafer has a first surface and includes an active device circuit on its first surface. The seal ring is adjacent the first surface of the MEMS wafer such that a seal is formed about the MEMS component. An external contact is provided on the wafer package. The external contact is accessible externally to the wafer package and is electrically coupled to the active device circuit of the active device wafer.

14 Claims, 7 Drawing Sheets

WAFER BONDING OF MICRO-ELECTRO MECHANICAL SYSTEMS TO ACTIVE CIRCUITRY

CROSS-REFERENCE TO RELATED APPLICATIONS

This Utility Patent Application is related to commonly assigned Utility patent application Ser. No. 11/012,574 filed on the same date as the present application, and entitled INTEGRATION OF MICRO-ELECTRO MECHANICAL SYSTEMS AND ACTIVE CIRCUITRY, which is herein incorporated by reference.

BACKGROUND

This invention relates to fabrication of electrical devices at a wafer level. Specifically, a micro-electro mechanical system component is bonded to an active semiconductor component at the wafer level.

Many electrical devices are very sensitive and need to be protected from harsh external conditions and damaging contaminants in the environment. For micro-electro mechanical systems (MEMS) devices, such as film bulk acoustic resonators (FBAR), surface mounted acoustic resonators (SMR), and surface acoustic wave (SAW) devices, this is particularly true. Such MEMS devices have traditional been insulated in hermetic packages or by providing a microcap layer over the MEMS device to hermetically seal the device from the surrounding environment.

Such hermetically sealed MEMS devices must also provide access points so that electrical connections can be made to the MEMS device. For example, an FBAR device configured with a microcap in a wafer package must be provided with holes or vias, through the microcap or elsewhere so that electrical contact can be made with the FBAR device within the wafer package to the other external electrical components, such as semiconductor components. Because both MEMS devices and active semiconductor devices require specialized fabrication sequences, directly constructing both MEMS devices and active circuitry on a single wafer requires significant comprises in performance, manufacturability, and cost.

For these and other reasons, a need exists for the present invention.

SUMMARY

One aspect of the present invention provides a single integrated wafer package including a micro electromechanical system (MEMS) wafer, an active device wafer, and a seal ring. The MEMS wafer has a first surface and includes at least one MEMS component on its first surface. The active device wafer has a first surface and includes an active device circuit on its first surface. The seal ring is adjacent the first surface of the MEMS wafer such that a hermetic seal is formed about the MEMS component. An external contact is provided on the wafer package. The external contact is accessible externally to the wafer package and is electrically coupled to the active device circuit of the active device wafer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
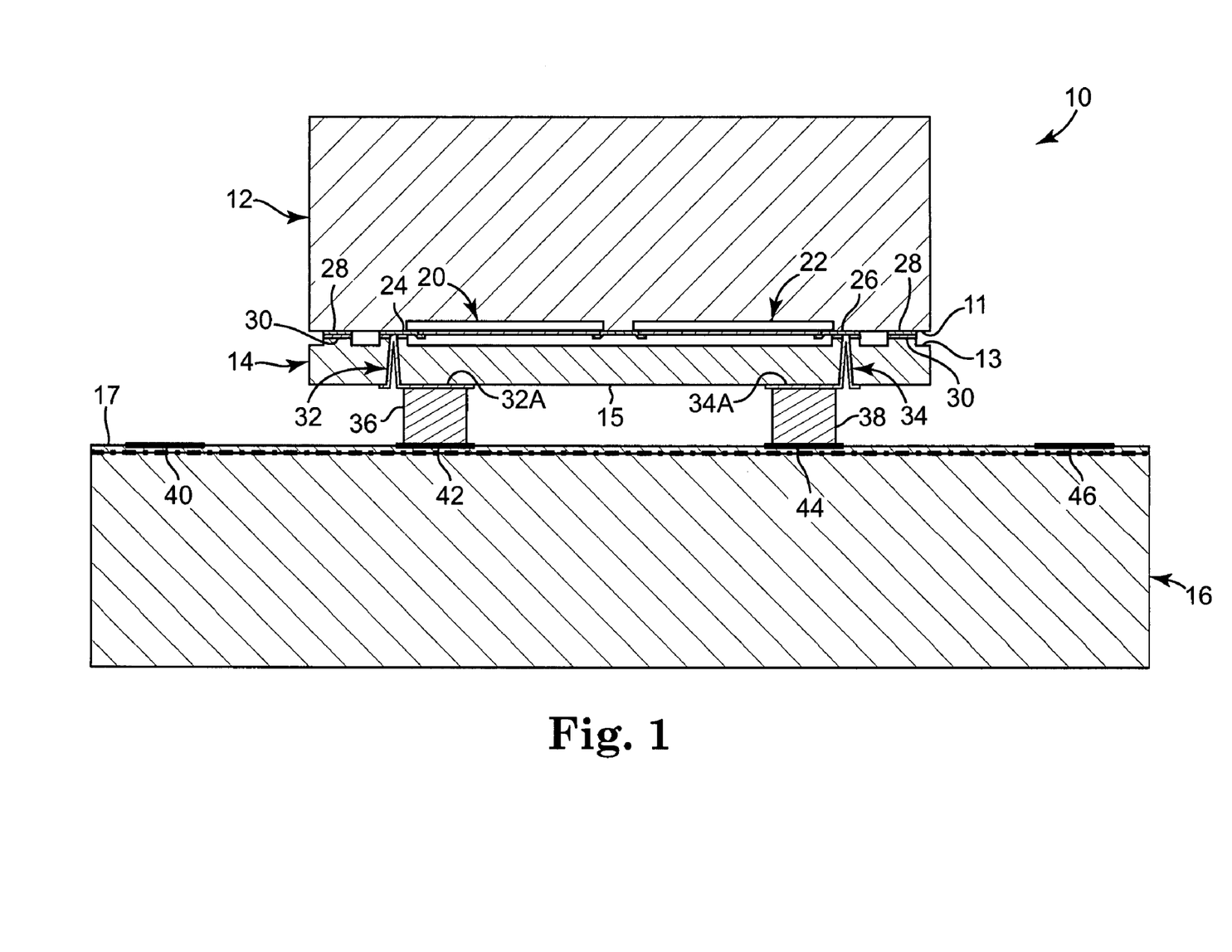
FIG. 1 illustrates a cross-sectional view of a single integrated wafer package including a MEMS wafer and an active device wafer in accordance with the present invention.

FIG. 1 illustrates single integrated wafer-level package 10 in accordance with the present invention. Wafer package 10 includes MEMS wafer 12, microcap 14, and active device wafer 16. In one embodiment, MEMS wafer 12 is a film bulk acoustic resonator (FBAR) substrate wafer and active device wafer 16 is a complementary metal oxide semiconductor (CMOS) substrate wafer. Wafer package 10 combines MEMS wafer 12 and active device wafer 16 while each are still at the wafer level into a single integrated wafer package. Wafer package 10 then includes external contacts (40 and 46 discussed further below), which are accessible externally to wafer package 10, such that it may be electrically coupled to other external components.

In one embodiment, MEMS wafer 12 includes MEMS components such as first FBAR 20 and second FBAR 22 on first surface 11. First and second MEMS-wafer contacts 24 and 26 are also on first surface 11 of MEMS wafer 12, and are electrically coupled to first and second FBARs 20 and 22, respectively. Finally, first surface 11 of MEMS wafer 12 includes peripheral bond pad 28, which extends around the periphery of first surface 11 of MEMS wafer 12.

Microcap 14 includes first and second surfaces 13 and 15. First microcap via 32 and second microcap via 34 extend though microcap 14 from first surface 13 to second surface 15. First microcap contact 32A extends within first via 32 and along second surface 15. Similarly, second microcap contact 34A extends within second via 34 and along second surface 15.

Active device wafer 16 includes first surface 17, which carries active device circuitry, such a CMOS circuit. First and second active-wafer inside bond pads 42 and 44 are adjacent first surface 17, and first and second active-wafer outside bond pads 40 and 46 are adjacent first surface 17. Bond pads 42 through 46 provide electrical connectivity to the active device circuitry of active device wafer 16. First and second active-wafer columns 36 and 38 are between first surface 17 of active device wafer 16 and second surface 15 of microcap 14.

In wafer package 10, microcap 14 protects MEMS wafer 12, and also provides electrical connection with active device wafer 16. In accordance with the present invention, wafer package 10 is fabricated at a wafer level such that MEMS wafer 12 and active device wafer 16 are already electrically coupled when wafer package 10 is singulated. In this way, the steps of electrically coupling MEMS wafer 12 to an active device wafer 16 after singulation is thereby avoided.

Microcap 14 provides protection and a seal to first and second FBARs 20 and 22 of MEMS wafer 12. In one embodiment, the seal provided is a hermetic seal. Specifically, seal ring 30 extends between MEMS wafer 12 and microcap 14 around their periphery immediately adjacent bond pad 28 of MEMS wafer 12. In this way, seal ring 30 surrounds first and second FBARs 20 and 22. Thus, in one embodiment, the combination of seal ring 30, first surface 11 of MEMS wafer 12, and first surface 13 of microcap 14 form a hermetic chamber, which hermetically seals first and second FBARs 20 and 22. Seal ring 30 may be formed in a variety of ways known in the art in conjunction with microcap 14. Microcap 14 may have a similar bond pad or gasket to that of bond pad 28 of MEMS wafer 12, in order to help seal against seal ring 30.

MEMS wafer 12 includes electrically conducting first and second contacts 24 and 26. First contact 24 is electrically coupled to first FBAR 20 and second contact 26 is electrically coupled to second FBAR 22. Through holes or vias 32 and 34 are respectively provided with contacts 32A and 34A, which electrically couple to first and seconds 24 and 26, respectively. Vias 32 and 34, and corresponding contacts 32A and 34A provide electrical connection with first and second FBARs 20 and 22 through microcap 14. Columns 36 and 38 are then electrically connected with contacts 32A and 34A, respectively. Columns 36 and 38 are also coupled electrically to active device wafer 16. Specifically, first and second inside bond pads 42 and 44 are coupled to columns 36 and 38, respectively. In this way, microcap 14 provides electrical connection between MEMS wafer 12 and active device wafer 16, while also sealing and protecting first and second FBARs 20 and 22. First and second outside bond pads 40 and 46 are provided on active device wafer 16 to provide electrical connection of active device wafer 16 to external devices.

Figure 2A:
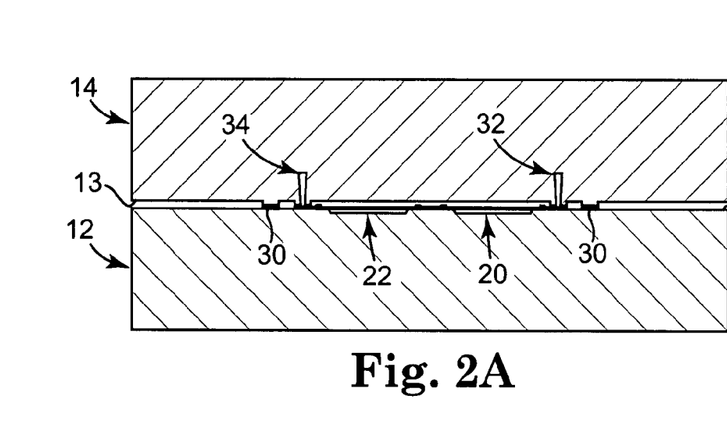
FIGS. 2A–2C illustrate process steps for fabricating the single integrated wafer package of FIG. 1 in accordance with the present invention.
Figure 2B:
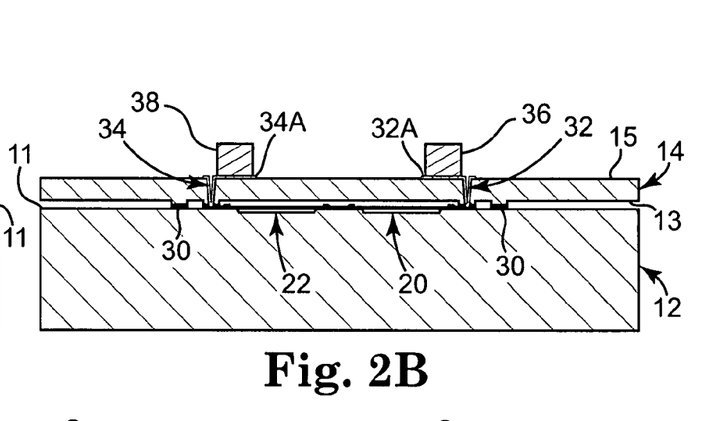
Figure 2C:
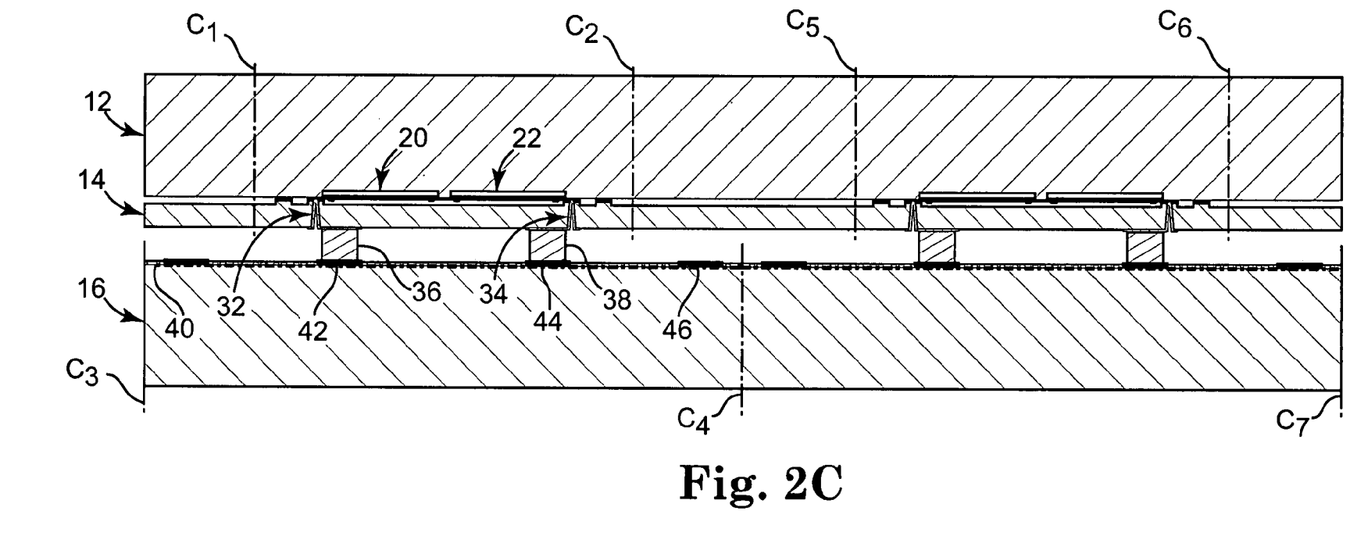

Wafer package 10 may be fabricated in a variety of ways consistent with the present invention. Fabrication of wafer package 10 according to one exemplary fabrication sequence is illustrated in FIGS. 2A–2C. In FIG. 2A, MEMS wafer 12 is illustrated coupled to microcap 14. In this stage of the fabrication sequence, microcap 14 is illustrated prior to its thinning. First and second vias 32 and 34 are etched into surface 13 of microcap 14, which is facing first surface 11 of MEMS wafer 12. First and second vias 32 and 34 are aligned with the bond pads on first surface 11 of MEMS wafer 12. Because microcap 14 has not yet been thinned, vias 32 and 34 are slots into surface 13 and do not penetrate through microcap 14 at this stage.

FIG. 2B illustrates a later stage of the fabrication sequence where microcap 14 has been thinned downed thereby exposing first and second vias 32 and 34 through second surface 15 of microcap 14. Second surface 15 is defined after microcap 14 is thinned to its final dimensions. Electrical contacts 32A and 34A are then formed within the exposed vias 32 and 34. First and second columns 36 and 38 are then formed over contacts 32A and 34A, respectively.

First and second columns 36 and 38 may be formed via any of a variety of bump technologies. For example, columns 36 and 38 could be flip-chip soldered bumps or copper pillar studs. In one embodiment, columns 36 and 38 are formed as a bump using a solder ball. In this case, a half sphere of solder is plated, attached to microcap 14 (or to contacts 32A and 34A thereon), and then the sphere of solder is melted to make a connection (between contacts 32A and 34A of microcap 14 and inside bond pads 42 and 44 of active device wafer 16). In another embodiment, columns 36 and 38 are formed as studs. In this case, copper is first plated up to a certain height. This provides a certain stand off distance from microcap 14 to active device wafer 16.

FIG. 2C illustrates a further stage of the fabrication sequence for wafer package 10. In FIG. 2C (and in FIG. 1), the device is illustrated oriented 180° rotated from those illustrated in FIGS. 2A and 2B. FIG. 2C illustrates how wafer package 10 is fabricated at the wafer level. Multiple wafer packages (also referred to as "die" or "dice") 10 can be cut from the longer wafers illustrated in FIG. 2C. For example, cut lines $C_1$–$C_7$ indicate the locations of partial saw cuts required to remove a single wafer package 10. Cut lines $C_1$, $C_2$, $C_3$, and $C_4$ are used to release a single wafer package 10.

As illustrated, cut lines $C_1$ and $C_2$ are offset with respect to cut lines $C_3$ and $C_4$. In one embodiment of wafer package 10, these offset cut lines are used so that a standoff distance is provided by the partial saw cuts. In other words, after the cuts are made along cut lines $C_1$, $C_2$, $C_3$, and $C_4$, microcap 14 and MEMS wafer 12 are narrower than is active device wafer 16. In this way, the standoff distance between microcap 14/MEMS wafer 12 and active device wafer 16 makes outside bond pads 40 and 46 accessible for connecting wafer package 10 with external electronic devices. Such connection to outside bond pads 40 and 46 could be made, for example, by wire bonding to outside bond pads 40 and 46.

In the process steps illustrated in FIGS. 2A–2C, first and second columns 36 and 38 were illustrated as formed on second surface 15 of microcap 14 after it was thinned. Alternatively, first and second columns 36 and 38 could have been formed on first surface 17 of active device wafer 16, which faces microcap 14 when the two are joined. Also, MEMS wafer 12 may be thinned after attachment to active device wafer 16, either before or after sawing occurs along the various cut lines.

Wafer package 10 is illustrated in FIGS. 1 and 2 as including a MEMS wafer 12 that is a FBAR. Specifically, first and second FBARs 20 and 22 are illustrated. One skilled in the art, however, will recognize that various MEMS devices may be used consistently with the present invention. Also, a single FBAR or other MEMS device such as a surface mounted acoustic resonator (SMR) could be used, or a plurality of other MEMS devices can also be used in accordance with the present invention. The microcap 14 provides both a means for sealing the MEMS devices while at the same time electrically coupling these devices to an active device, such as a CMOS wafer.

Figure 3:
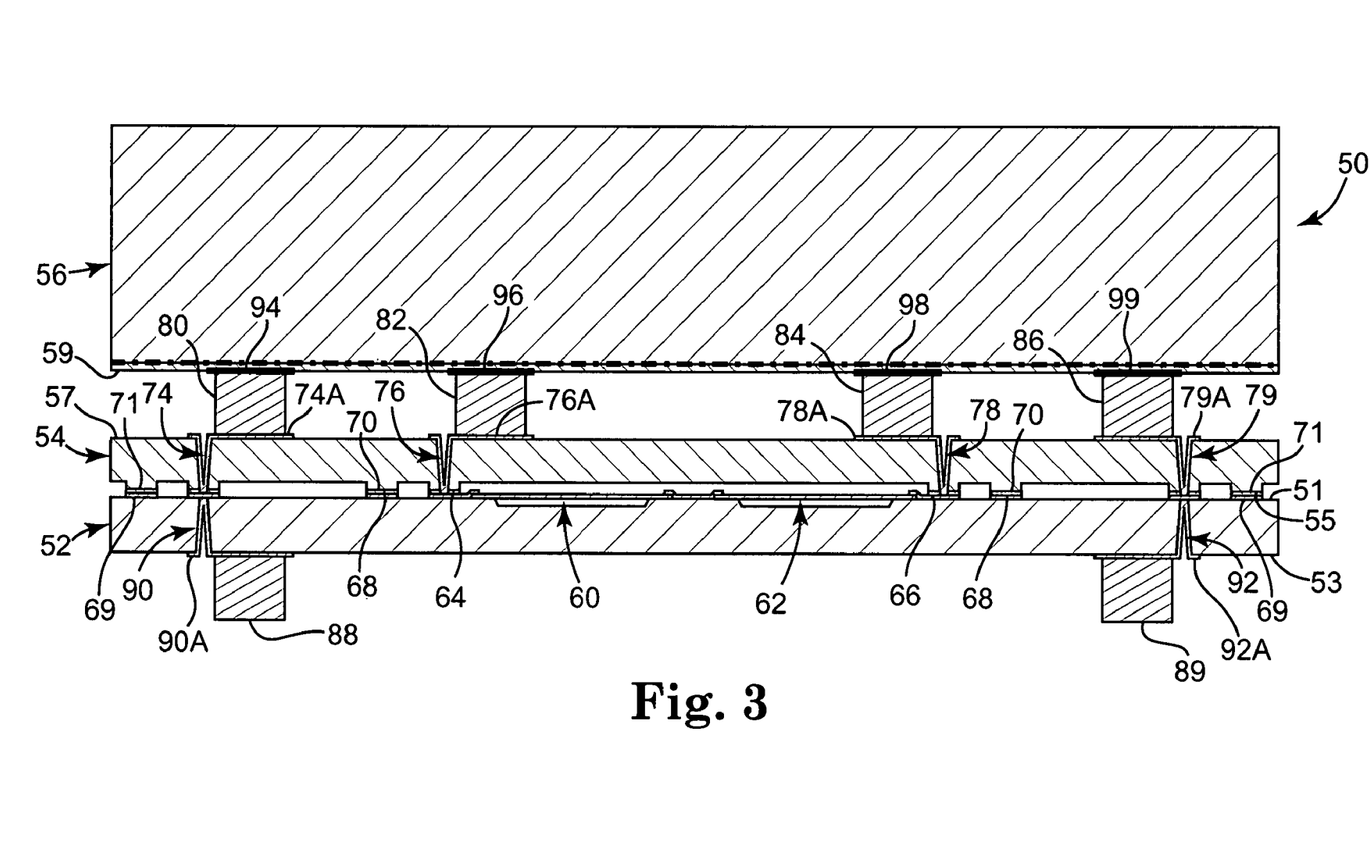
FIG. 3 illustrates a cross-sectional view of an alternative single integrated wafer package including a MEMS wafer and an active device wafer in accordance with the present invention.

FIG. 3 illustrates single integrated wafer-level package 50 in accordance with an alternative embodiment of the present invention. Wafer package 50 includes MEMS wafer 52, microcap 54, and active device wafer 56. In one embodiment, MEMS wafer 52 is an FBAR substrate wafer and active device wafer 56 is a CMOS substrate wafer. Wafer package 50 combines MEMS wafer 52 and active device wafer 56 while each are still at the wafer level into a single integrated wafer package. Wafer package 50 then includes external contacts (88 and 89 discussed further below), which are accessible externally to wafer package 50, such that it may be electrically coupled to other external components.

In one embodiment, MEMS wafer 52 includes MEMS components such as first FBAR 60 and second FBAR 62 on first surface 51. A single MEMS component, multiple components, or alternative MEMS components, such as a SMR, may also or alternatively be provided on first surface 51. First and second MEMS-wafer contacts 64 and 66 are also on first surface 51, and are electrically coupled to first and second FBARs 60 and 62, respectively. First surface 51 of MEMS wafer 52 also includes MEMS-wafer inner bond pad 68, which extends around the periphery of first and second FBARs 60 and 62, and MEMS-wafer outer bond pad 69, which extends around the periphery of first surface 51. Finally, first surface 51 of MEMS wafer 52 includes first and second MEMS-wafer vias 90 and 92, which extend from first surface 51 to second surface 53. MEMS-wafer electrical contacts 90A and 92A are formed within the first and second vias 90 and 92, respectively, and extend along second surface 53. First and second MEMS-wafer outer columns 88 and 89 are electrically coupled to first and second contacts 90A and 92B, respectively.

Microcap 54 includes first and second surfaces 55 and 57. First, second, third, and fourth microcap vias 74, 76, 78, and 79 extend though microcap 54 from first surface 55 to second surface 57. First, second, third, and fourth microcap electrical contacts 74A, 76A, 78A, and 79A are formed within the respective contact vias 74, 76, 78, and 79, and then each extend along second surface 57.

MEMS wafer 52 and microcap 54 are aligned and joined such that microcap 54 provides protection and a seal to first and second FBARs 60 and 62 of MEMS wafer 52. In one embodiment, the provided seal is hermetic. Specifically, an inner seal ring 70 extends between MEMS wafer 52 and microcap 54 around first and second FBARs 60 and 62 immediately adjacent inner bond pad 68 of MEMS wafer 52. In this way, inner seal ring 70 surrounds first and second FBARs 60 and 62. Thus in one embodiment, the combination of inner seal ring 70, first surface 51 of MEMS wafer 52, and first surface 55 of microcap 54 form a chamber, which hermetically seals first and second FBARs 60 and 62.

In one embodiment, outer seal ring 71 extends between MEMS wafer 52 and microcap 54 around their periphery immediately adjacent outer bond pad 69 of MEMS wafer 52, providing an additional seal. Inner and outer seal rings 70 and 72 may be formed in a variety of ways known in the art in conjunction with microcaps. In alternative embodiments, outer seal ring 71 may not extend around the periphery of MEMS wafer 52 and microcap 54, and rather, would help bond MEMS wafer 52 and microcap 54.

Electrical contact is provided through microcap 54 to MEMS wafer 52 in a variety of ways consistent with the present invention. For example, first contact 74A of microcap 54 is electrically coupled to first contact 90A of MEMS wafer 52, and fourth contact 79A of microcap 54 is electrically coupled to second contact 92A of MEMS wafer 52. A gasket or seal may also be provided around each of vias 74, 76, 78 and 79 where through contacts couple to MEMS wafer 52.

Active device wafer 56 includes first surface 59, which carries active device circuitry, such a CMOS circuit. First and second active-wafer outer bond pads 94 and 99, and first and second active-wafer inner bond pads 96 and 98 are adjacent first surface 59 of active device wafer 56. Bond pads 94 through 99 provide electrical connectivity to the active device circuitry of active device wafer 56. First and second active-wafer outer columns 80 and 86 and first and second active-wafer inner columns 82 and 84 are formed between first surface 59 of active device wafer 56 and second surface 57 of microcap 54, and they align with inner and outer bond pads 94 through 99.

In wafer package 50, microcap 54 protects MEMS wafer 52 providing a seal, and also provides electrical connection with active device wafer 56. In accordance with the present invention, wafer package 50 is fabricated at a wafer level such that MEMS wafer 52 and active device wafer 56 are already electrically coupled when wafer package 50 is singulated. In this way, the steps of electrically coupling MEMS wafer 52 to an active device wafer 56 after singulation is thereby avoided.

In one embodiment, wafer package 50 is provided with external electrical contacts such that wafer package 50 is ready for attachment to a circuit. Such attachment to other devices may be accomplished in a variety of ways consistent with the present invention. Wire bonding may be used to make electrical contact to the package, and in such case studs or bumps on the outer bond pads would not be necessary. In addition, columns 88 and 89 could be coupled directly to a circuit board or other application. Other bump bonding, stud bonding, and other types of bond may electrically connect wafer package 50 to external elements.

Figure 4A:
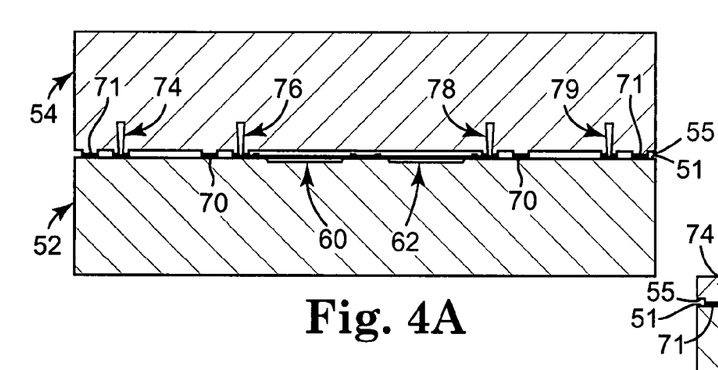
FIGS. 4A–4C illustrate process steps for fabricating the single integrated wafer package of FIG. 3 in accordance with the present invention.
Figure 4B:
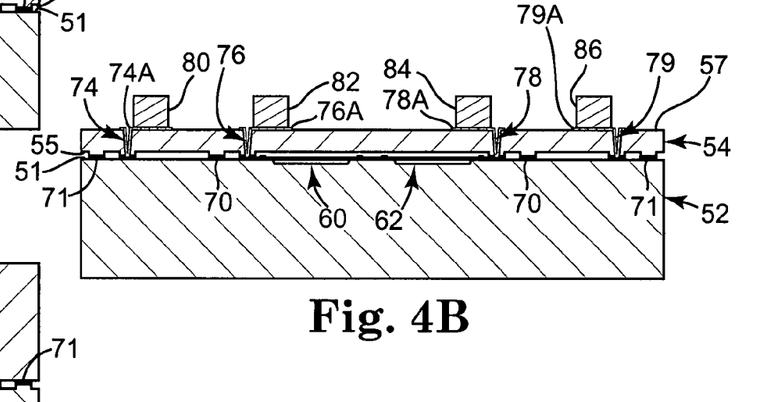
Figure 4C:
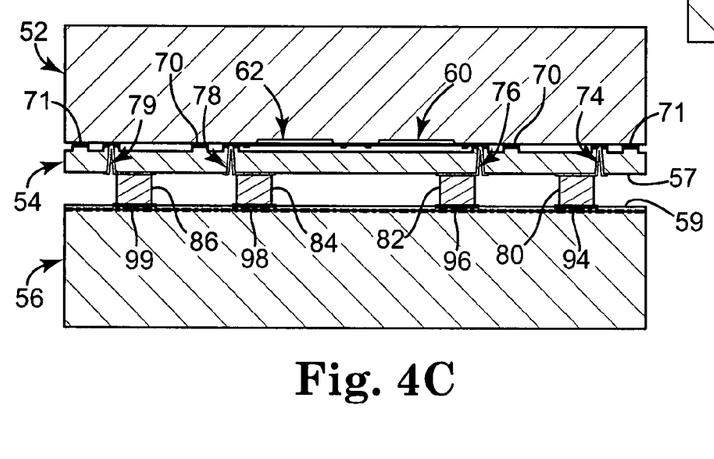

Wafer package 50 may be fabricated in a variety of ways consistent with the present invention. Fabrication of wafer package 50 according to one exemplary fabrication sequence is illustrated in FIGS. 4A–4C. FIG. 4A illustrates MEMS wafer 52 adjacent microcap 54. In FIG. 4A, microcap 54 has not yet been thinned. First, second, third, and fourth vias 74, 76, 78, and 79 are illustrated etched into first surface 55 of microcap 54, which is adjacent first surface 51 of MEMS wafer 52. Vias 74 through 79 are aligned relative to MEMS wafer 52 such that eventual electrical contacts may be made through them to MEMS wafer 52. Because microcap 54 has not yet been thinned, vias 74, 76, 78, and 79 are slots into surface 55 and do not penetrate through microcap 54 at this stage.

In an alternate process, a backside via may be used. In this case, thinning may or may not be utilized, because the via is made from the topside. If thinning is used, it may be done before or after the via is etched.

FIG. 4B illustrates a subsequent stage of the fabrication sequence for fabricating wafer package 50 according to one embodiment. In FIG. 4B, microcap 54 has been thinned exposing first through fourth microcap vias 74 through 79 such that they are open on the second surface 57 of microcap 54, which is facing away from MEMS wafer 52. First, second, third, and fourth electrical contacts 74A, 76A, 78A, and 79A are formed in exposed vias 74, 76, 78, and 79, respectively. Next, first and second outer columns 80 and 86 are formed on contacts 74A and 79A, respectively, and first and second inner columns 82 and 84 are formed on contacts 76A and 78A, respectively. In this way, electrical contact is made from MEMS wafer 52 through microcap 54 to inner and outer columns 80 through 86.

FIG. 4C illustrates a further step in the fabrication sequence for wafer package 53 according to one embodiment. MEMS wafer 52 and microcap 54 as illustrated in FIG. 4B are rotated 180° and placed adjacent active device wafer 56 in FIG. 4C. Alternatively, active device wafer 56 may be rotated. As illustrated, first and second outer columns 80 and 86 are aligned with first and second outer bond pads 94 and 99, respectively, and first and second inner columns 82 and 84 are aligned with first and second inner bond pads 96 and 98, respectively. In this way, electrical connection is made between active device wafer 56 through microcap 54 to MEMS wafer 52, all at the wafer level.

In a further fabrication step, MEMS wafer 52 is then thinned, and first and second MEMS-wafer vias 90 and 92 (illustrated in FIG. 3) are added to MEMS wafer 52, through its second surface 53. In addition, contact 90A and 92A are added in first and second vias 90 and 92, respectively. Finally, first and second outer columns 88 and 89 are fabricated on contacts 90A and 92A, respectively.

With reference to FIG. 3, it is illustrated that wafer package 50 provides external electrical connections, via first and second outer columns 88 and 89, to active device wafer 56. Electrical connection to active device wafer 56 is provided at first outer column 88, to contact 90A, to contact 74A, to first outer column 80, and to first outer bond pad 94 of active device wafer 56. Similarly, electrical connection to active device wafer 56 is provided at second outer column 89, to contact 92A, to contact 79A, to second outer column 86, and to second outer bond pad 99 of active device wafer 56. One skilled in the art will understand that these connections are illustrative and that some embodiments will include more than two connections.

In addition, electrical connection between active device wafer 56 and MEMS wafer 52 is provided as well. A first contact path is provided via first inner contact 96 on active device wafer 56, to first inner column 82, to contact 76A, to contact 64, which is in turn coupled to first FBAR 60. A second contact path is provided via second inner bond pad 98 of active device wafer 56, to second inner column 84, to contact 78A, to contact 66, which is coupled to second FBAR 62. As one skilled in the art will recognize, at least two connections are needed for a FBAR, which is not specifically illustrated in the figures. The FBARs may connect to one another to provide one of the connections, or additional connections may be provided similar to those that are illustrated. Electrical connections from external contacts to the active device circuitry and between active device circuitry and the MEMS components are all provided at the wafer level when wafer package 50 is assembled as a single component.

Unlike wafer package 10 illustrated in FIG. 1, wafer package 50 requires no partial saw with a standoff to allow access to the active device. Instead, outer columns 88 and 89 are provided for electrical connection to other external devices. Alternatively, outer columns 88 and 89 may be avoided and external connection may be made directly to contacts 90A and 92A. Inner and outer columns 80, 82, 84, and 86 are described above as active-wafer columns illustrated in FIG. 4B formed on microcap 54 before it is placed on active device wafer 56. Alternatively, columns 80 through 86 could be formed on active device wafer 56, and then microcap 54 can be coupled to active device 56.

Each of columns 80 through 86, as well as columns 88 and 89, may be formed via any of a variety of bump technologies. For example, columns 80 though 89 could be flip-chip soldered bumps or copper pillar studs. In one embodiment, columns 80 though 89 are formed as a bump using a solder ball. In this case, a half sphere of solder is first plated and attached, and then the sphere of solder is melted to make a connection. In another embodiment, columns 80 though 89 are formed as studs. In this case, copper is first plated up to a certain height. This provides a certain stand off distance from the surface.

Figure 5:
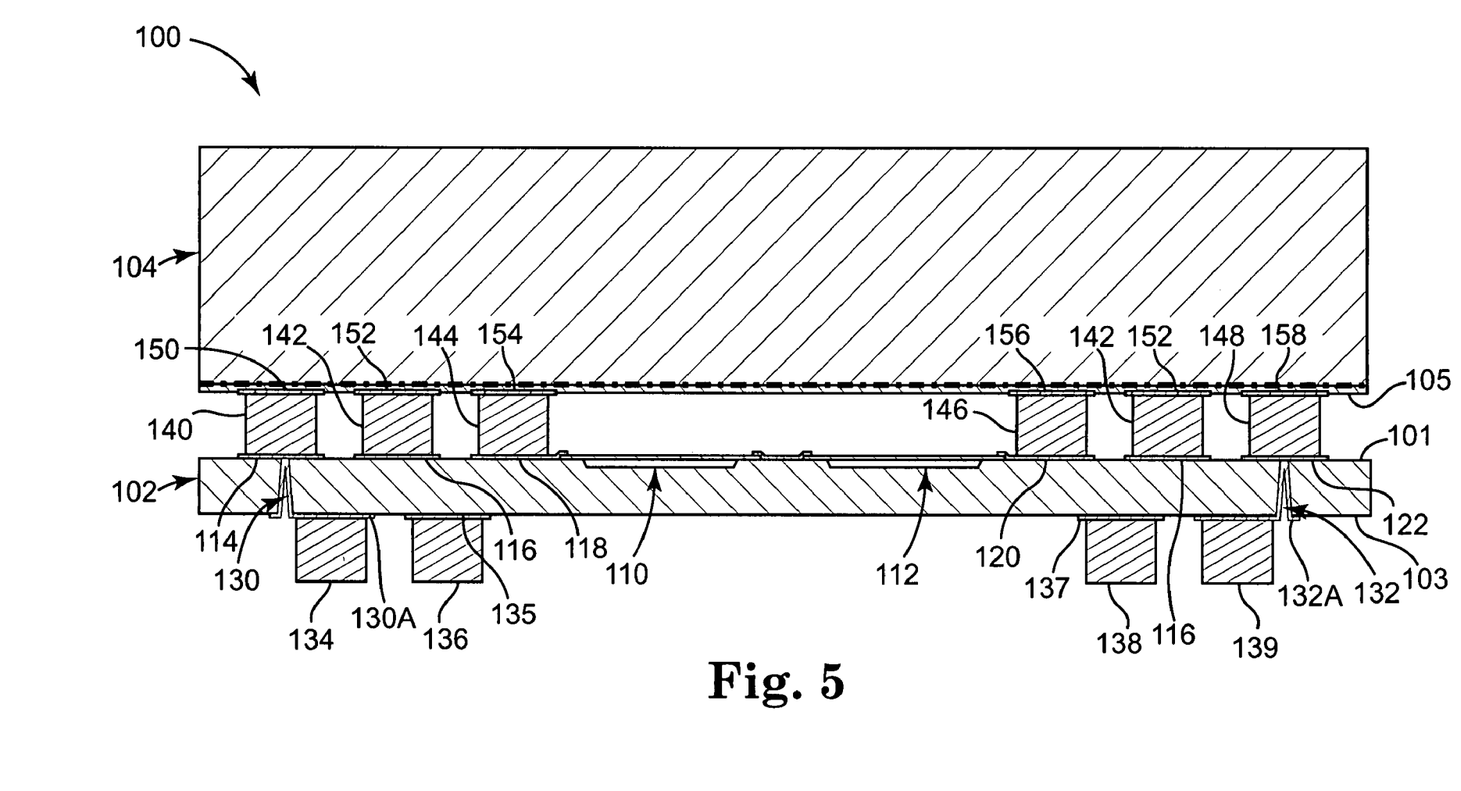
FIG. 5 illustrates a cross-sectional view of an alternative single integrated wafer package including a MEMS wafer and an active device wafer in accordance with the present invention.
Figure 6:
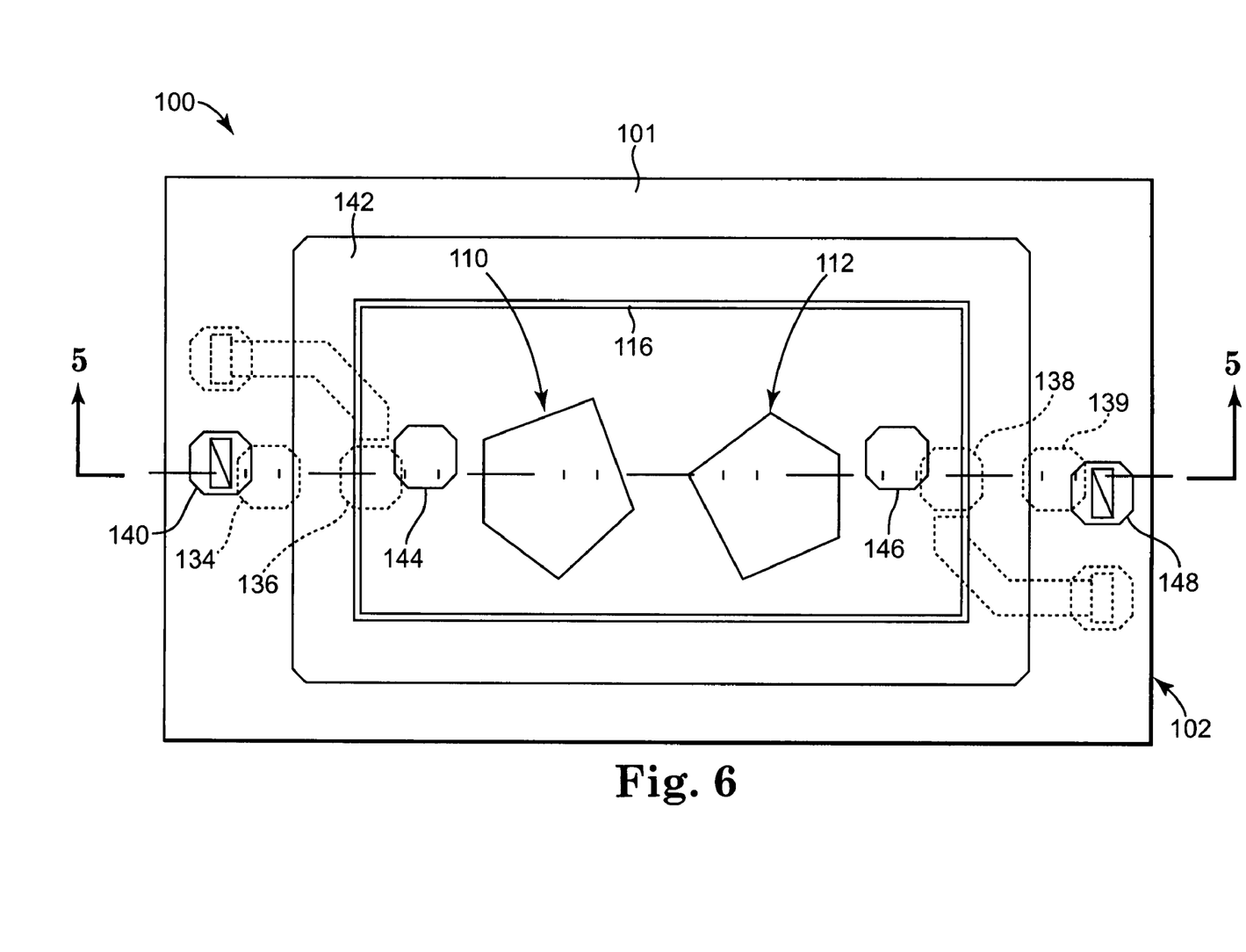
FIG. 6 illustrates a top plan view of the single integrated wafer package of FIG. 5.

FIGS. 5 and 6 illustrate single integrated wafer-level package 100 in accordance with an alternative embodiment of the present invention. FIG. 6 illustrates wafer package 100 in a plan view, while FIG. 5 illustrates a cross-sectional view taken along line 5—5 in FIG. 6. Wafer package 100 includes MEMS wafer 102 and active device wafer 104. Active device wafer 104 has been removed in FIG. 6 so that those objects below active device wafer 104 may be viewed.

MEMS wafer 102 has first and second surfaces 101 and 103. MEMS wafer 102 includes MEMS components, such as first and second FBARs 110 and 112, on first surface 101. A single MEMS component, multiple components, or alternative MEMS components, such as SMR, may also or alternatively be provided first surface 101. MEMS wafer 102 also includes first and second MEMS-wafer outer bond pads 114 and 122, first and second MEMS-wafer inner bond pads 118 and 120 and MEMS-wafer ring bond pad 116, all on first surface 101 of MEMS wafer 102. Ring bond pad 116 surrounds first and second FBARs 110 and 112, as illustrated in FIG. 6.

MEMS wafer 102 also includes first and second MEMS-wafer vias 130 and 132, which extend between first surface 101 and second surface 103 of MEMS wafer 102. First and second MEMS-wafer contacts 130A and 132A are formed within first and second vias 130 and 132, respectively, and extend along second surface 103. First and second MEMS-wafer inner bond pads 135 and 137 are also provided on the second surface 103 of MEMS wafer 102. Finally, first and second MEMS-wafer outer columns 134 and 139 are provided on the second surface 103 of MEMS wafer 102, adjacent contacts 130A and 132A, and first and second inner MEMS-wafer columns 136 and 138 are provided on the second surface 103 of MEMS wafer 102, adjacent first and second inner bond pads 135 and 137.

Active device wafer 104 includes a first surface 105, which carries active device circuitry, such a CMOS circuit. First and second active-wafer outer bond pads 150 and 158, first and second active-wafer inner bond pads 154 and 156 and active-wafer ring bond pad 152 are all provided on first surface 105 of active device wafer 104, and each may provide electrical connectivity to the active device circuitry in active device wafer 104. First and second active-wafer outer columns 140 and 148, first and second active-wafer inner columns 144 and 146, and active-wafer ring column 142 are provided between first surface 105 of active device wafer 104 and first surface 101 of MEMS wafer 102. In one embodiment, ring column 142 surrounds first and second FBARs 110 and 112, as illustrated in FIG. 6, and is formed adjacent ring bond pad 152 active device wafer 104 and ring bond pad 116 of MEMS wafer 102. First and second outer columns 140 and 148 are formed adjacent outer pads 150 and 158 of active device wafer 104 and outer pads 114 and 122 of MEMS wafer 102. First and second inner columns 144 and 146 are formed adjacent inner pads 154 and 156 of active device wafer 104 and inner pads 118 and 120 of MEMS wafer 102. The number of bond connections will differ with each application, and those illustrated are simply meant to be exemplary and not in any way limiting.

Inner and outer columns 144 and 146 and 140 and 148 provide electrical coupling between active device wafer 104 and MEMS wafer 102 (between bond pads 150, 154, 156 and 158 of active device wafer 104 and bond pads 114, 118, 120, and 122 of MEMS wafer 102). Ring column 142 is a ring-like structure that provides a seal around first and second FBARs 110 and 112. In some embodiments, ring column 142 may also provide a hermetic seal around first and second FBARs 110 and 112. In some embodiments, ring column 142 can also provide electrical coupling between active device wafer 104 and MEMS wafer 102 (between bond pad 152 of active device wafer 104 and bond pad 116 of MEMS wafer 102).

Whether the seal provided by ring column 142 is hermetic typically depends upon the MEMS device. Where the MEMS device is passivated, the seal provided by ring column 142 may not need to be hermetic. In an application where the MEMS device is an FBAR that is not passivated, seal provided by ring column 142 would need to be hermetic.

Inner and outer MEMS-wafer columns 136 and 138 and 134 and 139 provide external contacts for wafer package 100. Such external contacts provide a means of connection to other external devices, such as a circuit board. First and second MEMS-wafer outer columns 134 and 139 provide external connection to active device wafer 104, and the active device circuit carried thereon. Specifically, first outer column 134 is coupled to contact 130A, to first outer column 140, to first outer bond pad 150 of active device wafer 104. Thus, first outer column 134 provides electrical connectivity to active device circuitry on active device wafer 104. Similarly, second outer column 139 is coupled to contact 132A, to second outer column 148, to second outer bond pad 158 of active device wafer 104. One skilled in the art will understand that these connections are illustrative and that some embodiments will include more or less than four connections.

First and second MEMS-wafer inner columns 136 and 138 provide additional external connections to active device wafer 104. Alternatively, any one or combinations of columns 134, 136, 138, and 139 may be avoided and external connection may be made directly to one or combinations of contacts 130A, 135, 137, and 132A. In FIG. 6, traces and additional posts (illustrated as dashed lines) are illustrated as providing additional external electrical connections through to active device wafer 104, and the active device circuitry thereon.

Wafer package 100 provides a seal for the MEMS components carried on MEMS wafer 102, which are illustrated as first and second FBARs 110 and 112. In the embodiment illustrated in FIG. 5, the seal is provided between MEMS wafer 102, active device wafer 104, and ring column 142 such that no additional microcap is needed. In one embodiment, the seal provided is a hermetic seal. In addition, wafer package 100 provides external connectors (inner and outer columns 136 and 138 and 134 and 139) for electrically coupling external devices to the active device circuitry on active device wafer 104.

In wafer package 100, the combination of MEMS wafer 102, active device wafer 104, and ring column protects MEMS components FBARs 110 and 112, and also provides electrical connection with active device wafer 104. In accordance with the present invention, wafer package 100 is fabricated at a wafer level such that MEMS wafer 102 and active device wafer 104 are already electrically coupled when wafer package 100 is singulated. In this way, the steps of electrically coupling MEMS wafer 102 to an active device wafer 104 after singulation is thereby avoided.

Figure 7A:
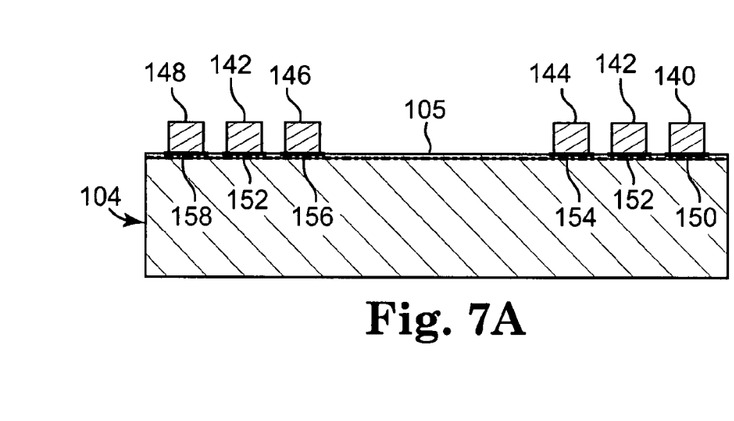
FIGS. 7A–7C illustrate the process steps for fabricating the single integrated wafer package of FIG. 5 in accordance with the present invention.
Figure 7B:
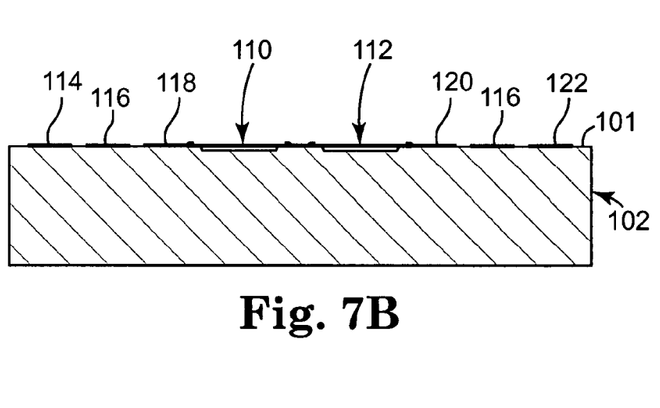
Figure 7C:
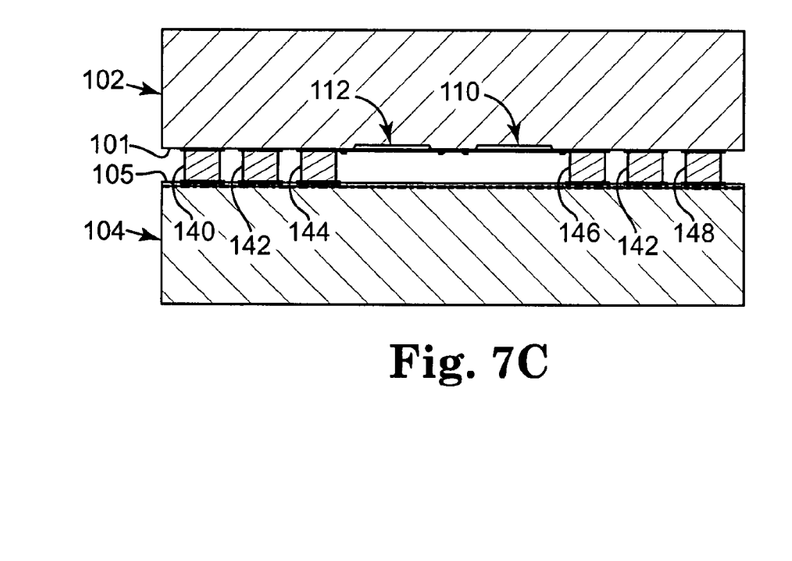

Wafer package 100 may be fabricated in a variety of ways consistent with the present invention. Fabrication of wafer package 100 according to one exemplary fabrication sequence is illustrated in FIGS. 7A through 7C. In FIG. 7A, active device wafer 104 is illustrated with first and second active-wafer outer bond pads 150 and 158, first and second active-wafer inner bond pads 154 and 156 and active-wafer ring bond pad 152 are all provided on first surface 105 of active device wafer 104. In addition, first and second active-wafer outer columns 140 and 148, first and second active-wafer inner columns 144 and 146, and active-wafer ring column 142 are provided on the various bond pads 150 through 158 on first surface 105 of active device wafer 104.

As with embodiments previously described, each of columns 140 through 148 may be formed via any of a variety of bump technologies. For example, they could be flip-chip soldered bumps or copper pillar studs. In one embodiment, columns 140 through 148 are formed as a bump using a solder ball. In this case, a half sphere of solder is first attached and plated, and then the sphere of solder is melted to make a connection. In another embodiment, columns 140 through 148 are formed as studs. In this case, copper is first plated up to a certain height. This provides a certain stand off distance from the surface.

In FIG. 7B, MEMS wafer 102 is illustrated with first and second FBARs 110 and 112, first and second MEMS-wafer outer bond pads 114 and 122, first and second MEMS-wafer inner bond pads 118 and 120 and MEMS-wafer ring bond pad 116, all on first surface 101 of MEMS wafer 102. At this stage, MEMS wafer 102 has not yet been thinned, and it has not yet been joined to active device wafer 104. Similar to prior-described embodiments, columns 140 through 148 may be formed on MEMS wafer 102 as an alternative to forming them on active device wafer 104.

In one embodiment illustrated in FIG. 7C, MEMS wafer 102 is joined with active device wafer 104, prior to MEMS wafer 102 being thinned. Inner and outer columns 144 and 146 and 140 and 148 and ring column 142 are all aligned with bond pads 150 through 158 of active device wafer 104 and bond pads 114 through 122 of MEMS wafer 102 in order to provide electrical coupling between active device wafer 104 and MEMS wafer 102 as described above in reference to FIGS. 5 and 6. In other embodiments, thinning would not be needed where a desired thickness is selected initially.

In a subsequent fabrication stage, MEMS wafer 102 is thinned and first and second MEMS-wafer vias 130 and 132 are formed. In an alternative embodiment, MEMS wafer 102 may be thinned, and vias 130 and 132 formed, before MEMS wafer 102 and active device wafer 104 are joined. First and second contacts 130A and 132A are then formed within first and second vias 130 and 132, first and second inner bond pads 135 and 137 are added, and inner and outer columns 134 through 139 are added adjacent contacts 130A and 132A and inner bond pads 135 and 137. Each of columns 134 through 139, as with columns 140 through 148, may be formed via any of a variety of bump or stud technologies.

Wafer package 100 provides external electrical connection to active device wafer 104, as well as electrical connection between MEMS wafer 102 and active device wafer 104. A first contact path is provided via first outer column 134, which is coupled to contact 130A, to first outer column 140, to first outer bond pad 150 of active device wafer 104. A second contact path is provided via second outer column 139, which is coupled to contact 132A, to second outer column 148, to second outer bond pad 158 of active device wafer 104. Electrical connections from external contacts to the active device circuitry and between active device circuitry and the MEMS components are all provided at the wafer level when wafer package 100 is assembled as a single component.

One skilled in the art will also see that it is also possible to put the vias in active device 104 rather than, or in addition to, MEMS wafer 102 of wafer package 100. In this way, connection to external components may be accomplished through vias in MEMS wafer 102 and/or active device 104.

Unlike wafer packages 10 and 50 previously described, wafer package 100 requires no microcap wafer. It also provides external contacts without any partial saw cut with a standoff to allow access to the active device. External contacts inner and outer columns 134 through 139 are provided for electrical connection to other external devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A single integrated wafer package comprising:
   a micro electromechanical system (MEMS) wafer with a first surface, the MEMS wafer having at least one MEMS component on its first surface:
   an active device wafer with a first surface, the active device wafer having an active device circuit on its first surface and configured to be spaced apart from the MEMS wafer such that the first surface of the MEMS wafer faces the first surface of the active device wafer;
   a seal ring adjacent the first surface of the MEMS wafer such that a seal is formed about the MEMS component by at least the combination of the seal ring and the first surface of the MEMS wafer; and
   an external contact to the single integrated wafer package, wherein the external contact accessible externally to the single integrated wafer package and is electrically coupled to the active device circuit of the active device wafer.

2. The single integrated wafer package of claim 1, wherein the seal formed about the MEMS component comprises a hermetic seal.

3. The single integrated wafer package of claim 1, wherein the MEMS component is one of a group comprising a thin film acoustic resonator (FBAR) and a solidly mounted acoustic resonator (SMR).

4. The single integrated wafer package of claim 1, wherein the seal ring is also adjacent the first surface the active device wafer such that the seal is formed by the combination of the seal ring, the first surface the active device wafer, and first surface the MEMS wafer.

5. The single integrated wafer package of claim 4, wherein the formed seal is a hermetic seal.

6. The single integrated wafer package of claim 4, wherein the seal ring between the MEMS wafer and the active device wafer is a copper pillar ring surrounding the MEMS component and that couples the wafers together such that they form a single integrated component.

7. The single integrated wafer package of claim 1, wherein the MEMS wafer further includes at least one via through which an electrical connection is made between the external contact and at least one of the group comprising the active device circuit and the MEMS component.

8. The single integrated wafer package of claim 1, wherein the active device wafer further includes at least one via through which an electrical connection is made between the external contact and at least one of the group comprising the active device circuit and the MEMS component.

9. The single integrated wafer package of claim 7, wherein at least one column is formed between the MEMS wafer and the active device wafer, the column aligned with the via such that the column facilitates the electrical connection between the active device circuit and the external contact.

10. The single integrated wafer package of claim 8, wherein at least one column is formed between the MEMS wafer and the active device wafer, the column aligned with the via such that the column facilitates the electrical connection between the MEMS wafer and the external contact.

11. A single integrated wafer package comprising:
    a micro electromechanical system (MEMS) wafer with a first surface, the MEMS wafer having at least one MEMS component on its first surface;
    an active device wafer with a first surface, the active device wafer having an active device circuit on its fist surface;
    a seal ring adjacent the first surface of the MEMS wafer such that a seal is formed about the MEMS component;
    an external contact to the single integrated wafer package, wherein the external contact accessible externally to the single integrated wafer package and is electrically coupled to the active device circuit of the active device wafer; and
    a microcap wafer coupled between the MEMS wafer and the active device wafer, and wherein the seal ring is sandwiched between the MEMS wafer and the microcap wafer thereby providing the seal about the MEMS component.

12. The single integrated wafer package of claim 11, wherein the seal formed about the MEMS component comprise a hermetic seal.

13. The single integrated wafer package of claim 11 wherein the MEMS wafer further includes at least one via through which an electrical connection is made between the external contact and at least one of the group comprising the active device circuit and the MEMS component.

14. The single integrated wafer package of claim 11 wherein the active device wafer further includes at least one via through which an electrical connection is made between the external contact and at least one of the group comprising the active device circuit and the MEMS component.

* * * * *

UNITED STATES PATENT AND TRADEMARK OFFICE
CERTIFICATE OF CORRECTION

PATENT NO. : 7,202,560 B2  Page 1 of 1
APPLICATION NO. : 11/012589
DATED : April 10, 2007
INVENTOR(S) : Thomas Duggan It is certified that error appears in the above-identified patent and that said Letters Patent is hereby corrected as shown below:

Col. 11 Line 40 In Claim 1, delete "surface:" and insert -- surface; --, therefor.

Col. 12 Line 36 In Claim 11, delete "fist" and insert -- first --, therefor.

Signed and Sealed this

Second Day of December, 2008

JON W. DUDAS
*Director of the United States Patent and Trademark Office*